US008221834B2

(12) United States Patent
Hua et al.

(10) Patent No.: US 8,221,834 B2
(45) Date of Patent: Jul. 17, 2012

(54) TITANIA COMPOSITE AND PREPARING METHOD THEREOF

(75) Inventors: Dong Hua, Chonqing (CN); Zhengtao Liu, Chongqing (CN)

(73) Assignee: Chongqing Kechang Technology Co., Ltd., Chongqing (CN)

( * ) Notice: Subject to any disclaimer, the term of this patent is extended or adjusted under 35 U.S.C. 154(b) by 0 days.

(21) Appl. No.: 13/141,533

(22) PCT Filed: Dec. 30, 2009

(86) PCT No.: PCT/CN2009/076255
§ 371 (c)(1),
(2), (4) Date: Jun. 22, 2011

(87) PCT Pub. No.: WO2010/078820
PCT Pub. Date: Jul. 15, 2010

(65) Prior Publication Data
US 2011/0253012 A1 Oct. 20, 2011

(30) Foreign Application Priority Data

Jan. 6, 2009 (CN) .......................... 2009 1 0103012

(51) Int. Cl.
C01G 23/053 (2006.01)
C01F 11/46 (2006.01)
C09C 1/02 (2006.01)
C09C 1/36 (2006.01)
C09C 3/06 (2006.01)

(52) U.S. Cl. ........ 427/218; 106/439; 106/449; 427/215; 428/403; 428/404

(58) Field of Classification Search .................. 106/436, 106/449; 427/215, 218; 428/403, 404
See application file for complete search history.

(56) References Cited

U.S. PATENT DOCUMENTS
3,840,381 A * 10/1974 Watanabe ..................... 106/415

FOREIGN PATENT DOCUMENTS
CN 101245198 A 8/2008
JP 48-56833 A * 8/1973

OTHER PUBLICATIONS

Derwent-Acc-No. 1999-278285, abstract of Chinese Patent Specification No. CN 1206727A (Mar. 1999).*
Derwent-Acc-No. 2008-H33103, abstract of Chinese Patent Specification No. CN 101168838A (Apr. 2008).*
Written Opinion for PCT International Application PCT/CN2009/076255 (Apr. 2010).*
Chen Guiguang et al. "Preparation and Photocatalysis Performance of BaSO4/TiO2 Composite Particles", The Chinese Journal of Process Engineering, Feb. 2005, vol. 5, No. 1, pp. 66-69.*
Translation of Chen Guiguang et al. "Preparation and Photocatalysis Performance of BaSO4/TiO2 Composite Particles", The Chinese Journal of Process Engineering, Feb. 2005, vol. 5, No. 1, pp. 66-69.*
Office Action, Chinese Application No. 200910103012.6, citing CN101245198A, with a statement of relevance for the Office Action.

* cited by examiner

Primary Examiner — Anthony J Green
(74) Attorney, Agent, or Firm — Nath, Goldberg & Meyer; Tanya E. Harkins

(57) ABSTRACT

A titania composite and a preparing method thereof are provided. The titania composite comprises an inner core and a coating film layer, wherein the inner core is a barium sulfate crystal and/or a strontium sulfate crystal with subsphaeroidal shape, having a particle size of less than 1 μm and whiteness of more than 98%, and the coating film layer is nano rutile titania. The preparing method thereof comprises the following steps: (a) preparing barium sulfate or strontium sulfate; (b) coating treatment; (c) subjecting the titania composite to a high-temperature heat treatment; and (d) subjecting the titania composite to a post treatment. The subsphaeroidal titania composite is obtained by chemically synthesizing a subsphaeroidal submicron barium sulfide or strontium sulfide, and then hydrolyzing and coating thereon to form a coating film layer of titania to make titania grow evenly. The particle size of the titania composite is small, and the particle size distribution range of the titania composite is controllable.

9 Claims, 2 Drawing Sheets

TITANIA COMPOSITE AND PREPARING METHOD THEREOF

This is a National Phase Application filed under 35 U.S.C. §371 as a national stage of PCT/CN2009/076255, filed on Dec. 30, 2009, claiming the benefit from Chinese Patent Application 200910103012.6, filed on Jan. 6, 2009, the content of each of which is hereby incorporated by reference in its entirety.

TECHNICAL FIELD

The present invention relates to a titanium compound, especially, relates to a titania composite comprising a coated inner core and a preparing method thereof.

BACKGROUND ART

Titanium white (titanium dioxide) powder pigment has good properties including hiding power, tinting strength and opacity, and is able to restrain light, heat and acid-base, so it is used as a kind of white pigment having the best properties, and has been widely used in many fields, such as coatings, fibers, plastics, papermaking, inks With the rapid development of national economy, the demand for titanium white increases continually. The situation of titanium white powder in short supply appears, as a result of that the titanium resources in world are relatively in shortage, and the process for preparing titanium white possesses complex operation, large energy consumption and costly environment protection expense. At the same time, presently most uses of titania is based on its physical and chemical properties of surface, such as higher refractive index, so it is necessary to synthesize a titania composite.

In February, 1999, China Patent CN1206727 disclosed a method of preparing a nanometer composite titanium white, wherein ore powder is used as an inner core, coated with nano ultra-fine $TiO_2$ evenly on the surface to obtain the nanometer composite titanium white. On Apr. 3, 2008, China Patent CN101168838 disclosed a method of preparing a mica titanium material with the following specific steps: dispersing sericite powder evenly in distilled water, putting into water bath at 80° C. to 90° C., dropping $TiCL_4$ solution slowly, adjusting the pH value of the system within a scope of 1.8 to 2.2, and reacting for 2 to 4 hours; then washing with distilled water until the conductivity of filtrate is less than 10MS/S, calcinating at 800° C. to 1000° C. for 0.5-2 hours after drying, and then to obtain the products. On Aug. 20, 2008, China Patent CN101245198 disclosed a type of coated titanium white powder and a preparing method thereof, wherein the coated titanium white powder comprises an inner core and a coating film layer, the inner core is ultra-fine ore powder, and the coating film layer is nano rutile titania; the method of preparing the coated titanium white powder comprises the following specific steps: A. preparing slurry from raw ore powder, B. coating treatment, C. catalyzing the slurry of the coated titanium white powder, D. subjecting the slurry of the coated titanium white powder to a high-temperature heat treatment, E. subjecting the coated titanium white powders to a post treatment.

All the above three types of titanium white powder composites used ore powder as the inner core. The ore powder particle has irregular appearance and coarse particle size a wide range of the particle size distribution, which thus turns out that the titanium white product has irregular appearance, coarse particle size and a wide range of particle size distribution. Moreover, since the titania powder is added into the suspension of ore powder directly, and is coated on the surface of ore powder after dissolving, it can not be ensured that the titania grows on all the surface of ore powder. In addition, the particle size distribution of the titania product is within a wide range, due to that the growth rate of titania can not be controlled. In a word, all the current titania composites have the defects of irregular appearance, coarse particle size and the wide range of particle size distribution, so that limits the applications of titanium white powder in top-grade fields.

SUMMARY OF THE INVENTION

One of the objects of the present invention is to provide a titania composite with spheroidal or a subsphaeroidal appearance, and having small particle size.

To achieve the above object, the present invention provides the following technical solution: a titania composite comprises an inner core and a coating film layer, wherein the inner core is a barium sulfate crystal and/or a strontium sulfate crystal, having a particle size of less than 1 μm and whiteness of more than 98%, and the coating film layer is nano rutile titania.

Another object of the present invention is to provide a method of preparing a titania composite with spheroidal or subsphaeroidal appearance and small particle size, wherein the method comprises the following steps:

(a) Preparing Barium Sulfate or Strontium Sulfate consecutively reacting barium sulfide or strontium sulfide with excess sulfuric acid by cocurrent flowing to produce barium sulfate or strontium sulfate and hydrogen sulfide, discharging the hydrogen sulfide by degassing, then obtaining a suspension of barium sulfate or strontium sulfate after separating and washing treatment;

(b) Coating Treatment adding titanium tetrachloride or titanyl sulfate into the suspension of barium sulfate and/or strontium sulfate, wherein the amount of $TiO_2$ in the titanium tetrachloride or titanyl sulfate is 4% to 35% in a total weight of $TiO_2$ and barium sulfide and/or strontium sulfide when the addition amount of titanium tetrachloride or titanyl sulfate is based on stoichiometric amount of $TiO_2$ in the titanium tetrachloride or titanyl sulfate; hydrolyzing and coating in the temperature range of 60° C. to 95° C. for 2 to 4 hours, and then obtaining a titania composite after separating and washing treatment;

(c) Subjecting the Titania Composite to a High-Temperature Heat Treatment subjecting the titania composite obtained in step (b) to a high-temperature heat treatment in the temperature range of 600° C. to 1200° C. for 50 min to 70 min; and (d) Subjecting the Titania Composite to a Post Treatment cooling the titania composite treated after high-temperature heat treatment, crushing and sieving, to obtain the product.

In a preferred embodiment, in the step (a), the concentration of barium sulfide or strontium sulfide in the solution is 70~130 g/L, the temperature of reaction is 45° C. to 85° C., and the speed of adding barium sulfide solution is 500 L/h to 4500 L/h and the speed of adding strontium sulfide solution is 100 L/h to 4000 L/h.

In another preferred embodiment, in the step (a), the concentration of sulfuric acid remained in the slurry of barium sulfate or strontium sulfate is 0.5 to 25 g/L, after carrying out the reaction between the barium sulfide and/or strontium sulfide and excess sulfuric acid.

In another preferred embodiment, in the step (a), said barium sulfide is produced by calcinating barite by virtue of coal; said strontium sulfide is produced by calcinating strontium sulfate by virtue of coal.

In another preferred embodiment, in the step (a), hot air is introduced in the slurry of barium sulfate or strontium sulfate for degassing after carrying out the reaction, wherein the air volume of hot air is 3000 $M^3/h$ to 7000 $M^3/h$, the temperature of hot air is 45° C. to 80° C., and the degassing time is 1.5 to 3 hours.

In another preferred embodiment, in the step (b), after carrying out the procedures of ing and coating, neutralization with base is conducted before the procedure of separating.

In another preferred embodiment, in the step (c), the titania composite obtained in the step (b) is firstly heated up to the temperature of 600° C. to 1200° C. under the heating rate of 2° C./min to 5° C./min, and then keeping the temperature for 50 min to 70 min.

Compared with the prior art, the present invent has the following advantages:

(1) In the present invention, the submicron particle with spheroidal or subsphaeroidal appearance is obtained by chemically synthesis, and then induced hydrolyzing and coating with titania to make titania grow evenly, to finally obtain titania composite with spheroidal or subsphaeroidal appearance. Moreover, the particle size of the inner core is controlled by controlling the reaction speed of the barium sulfide or the strontium sulfide, and the desired particle size distribution range is finally obtained by controlling the concentration of titanium tetrachloride or titanyl sulfate so as to control the formation rate of inner core. In the present invention the desired rutile crystal structure is produced by induced hydrolysis to form core-shell structure and subjecting it to heat treatment.

(2) In the present invention, the rutile titania composite material having low hardness is produced by coating with nano film layer, and keeping the hardness of the barium sulfide or the strontium sulfide.

(3) In the present invention, the surface properties of rutile titania material is maintained, as well as high physical and chemical stability of sulfates is used, so the titania composite capable of anti-powdering is provided, and the weatherability of rutile titania material is improved.

(4) The present invention maintains the application performances of rutile titania material and reduces the material cost and the pollution at the same time. In addition, China has abundant barium and strontium resources, which can well support the sustainable development of titania industry.

EMBODIMENTS

The present invention is further illustrated on the basis of the combination of figures and examples as follows.

Example 1

(a) Preparing the Barium Sulfate Crystal

Figure 1:
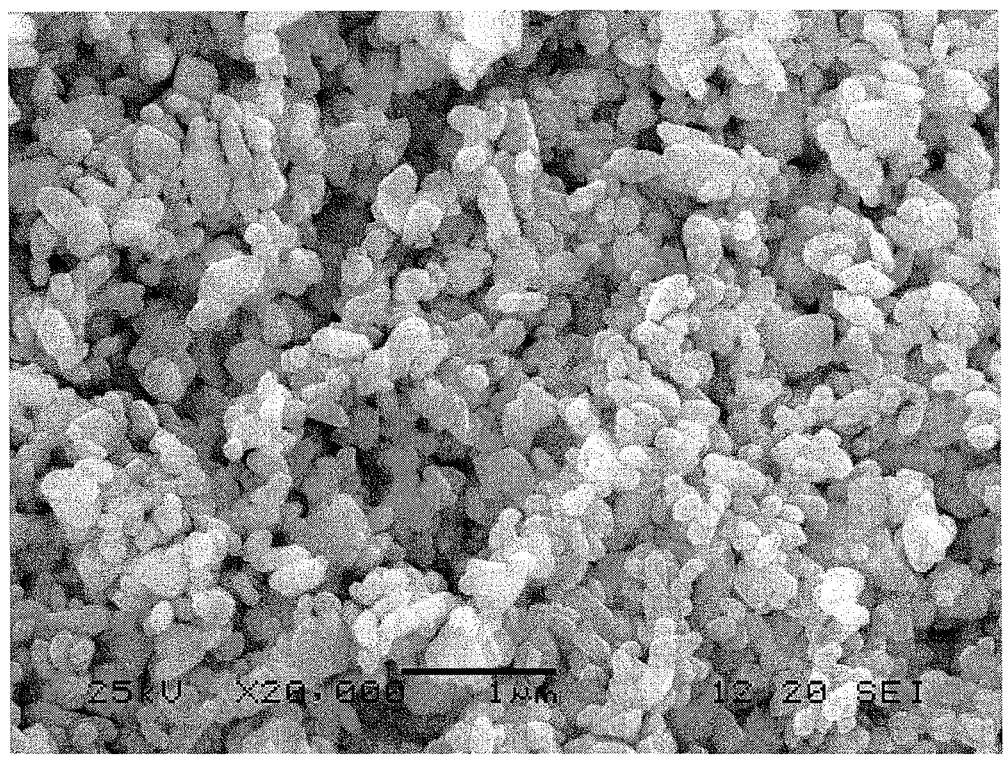
FIG. 1 shows a SEM (Scanning electron microscopy) image of barium sulfate obtained according to example 1 in the invention.

The barite and hard coal is mixed and calcinated together to obtain the crude barium sulfide containing barium sulfide; the crude barium sulfide is put into leacher and soaked with hot water at 80° C. to obtain the barium sulfide solution with the concentration of 137 g/L, and the temperature is adjusted to 65° C. Then, the barium sulfide solution is put into consecutive reactor together with excess sulfuric acid (industrial sulfuric acid with the concentration of 98%), to consecutively react by cocurrent flowing to produce the barium sulfate slurry and the hydrogen sulfide, wherein the speed of adding barium sulfide solution is 4000 L/h, and the addition amount of sulfuric acid is calculated on the basis of the concentration of sulfuric acid of 2.5 g/L remained in barium sulfate slurry after carrying out the reaction. After that, hot air is introduced in the barium sulfate slurry to degas the hydrogen sulfide, wherein the air volume of hot air is 3500 $M^3/h$, the temperature of hot air is 60° C., and the degassing time is 2.5 hours. The barium sulfate slurry is dewatered and washed (the ratio of material to water is 1 to 7, the temperature is 90° C., the time is 2 hours) after degassing. The product is detected by SEM, the result indicates that the barium sulfate has spheroidal or subsphaeroidal appearance showed as FIG. 1.

(b) Coating Treatment

Titanium tetrachloride is added into the barium sulfate slurry, wherein the addition amount of titanium tetrachloride is based on stoichiometric amount of $TiO_2$ in the titanium tetrachloride, the amount of $TiO_2$ in the titanium tetrachloride presents 14.5% by weight in the total weight of $TiO_2$ and barium sulfate. The system is hydrolysized and coated at 87° C. for 2 hours, neutralized with sodium hydroxide after that, then filtered to separate and washed with water to obtain the titania composite.

(c) Subjecting the Titania Composite to the High-Temperature Heat Treatment

The titania composite obtained in step (b) is heated from room temperature up to 900° C. under the heating rate of 4° C./min, and then kept at this temperature for 60 min.

(d) Subjecting the Titania Composite to the Post Treatment

The titania composite treated after the high-temperature heating is crushed and sieved to obtain the product.

Figure 2:
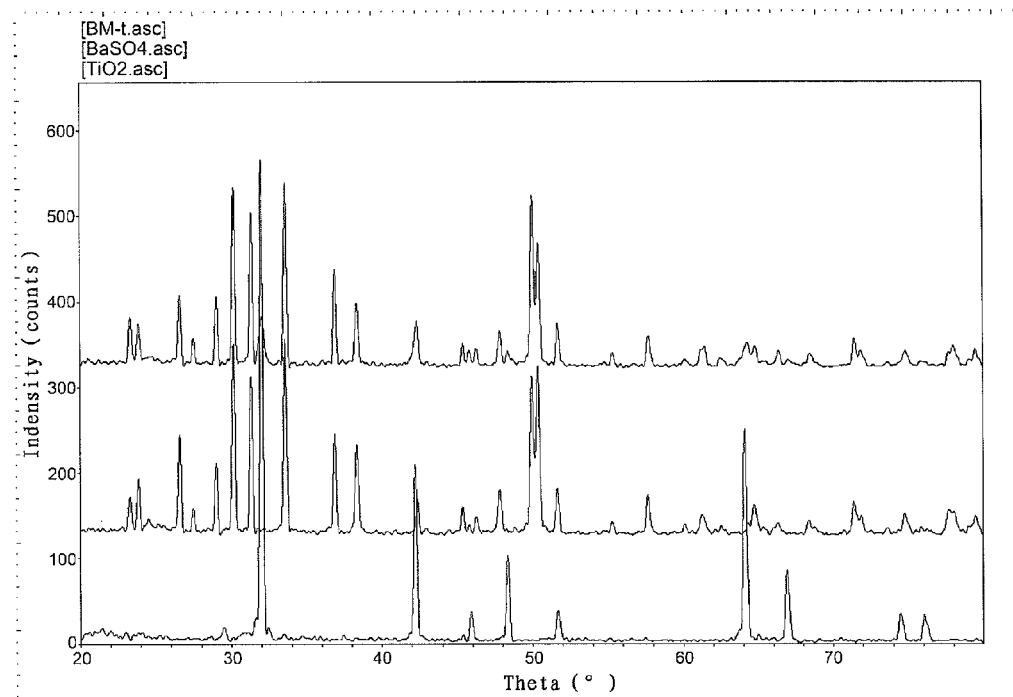
FIG. 2 shows overlapped XRD (X ray diffraction) spectrum from cobalt target.

The titania composite prepared in example 1 is detected by XRD, the result indicates that the titania composite has the structure of comprising an inner core and a coating film layer as showed in FIG. 2.

Example 2

(a) Preparing the Strontium Sulfate Crystal

The strontium sulfate and hard coal is mixed and calcinated together to obtain the crude strontium sulfide containing strontium sulfide; the crude strontium sulfide is put into leacher and soaked with hot water at 80° C. to obtain the strontium sulfide solution with the concentration of 75 g/L and the temperature is adjusted to 70° C. Then, the strontium sulfide solution is put into consecutive reactor together with excess sulfuric acid (industrial sulfuric acid with the concentration of 98%), to consecutively react by cocurrent flowing to produce the strontium sulfate slurry and the hydrogen sulfide, wherein the speed of adding strontium sulfide solution is 2500 L/h, and the added amount of sulfuric acid is calculated on the basis of the concentration of sulfuric acid of 7 g/L remained in strontium sulfate slurry after carrying out the reaction. After that, hot air is introduced in the strontium sulfate slurry to degas the hydrogen sulfide, wherein the air volume of hot air is 4000 $M^3/h$, the temperature of hot air is 60° C., and the degassing time is 2 hours. The strontium sulfate slurry is dewatered and washed (the ratio of material to water is 1 to 8, the temperature is 90° C., the time is 3 hours) after degassing.

(b) Coating Treatment

Titanium tetrachloride is added into the strontium sulfate slurry, wherein the added amount of titanium tetrachloride is based on stoichiometric amount of $TiO_2$ in the titanium tetrachloride, the amount of $TiO_2$ in the titanium tetrachloride presents 15% by weight in the total weight of $TiO_2$ and strontium sulfide. The system is hydrolysized and coated at 90° C. for 2 hours, neutralized with sodium hydroxide after that, then filtered to separate and washed with water to obtain the titania composite.

(c) Subjecting the Titania Composite to the High-Temperature Heat Treatment

The titania composite obtained in step (b) is heated from room temperature up to 850° C. under the heating rate of 3.5° C./min, and then kept at this temperature for 60 min.

(d) Subjecting the Titania Composite to the Post Treatment

The titania composite treated after the high-temperature heating is crushed and sieved, to obtain the product.

Example 3

(a) Preparing the Barium Sulfate Crystal and the Strontium Sulfate Crystal

The barium sulfate crystal and the strontium sulfate crystal are prepared respectively according to the method of example 1 and example 2.

(b) Coating Treatment

Titanyl sulfate is added into the slurry mixture of barium sulfate and strontium sulfate, wherein the added amount of titanyl sulfate is based on stoichiometric amount of $TiO_2$ in the titanyl sulfate, the amount of $TiO_2$ in the titanyl sulfate presents 20% by weight in the total weight of $TiO_2$, barium sulfate and strontium sulfide. The system is hydrolysized and coated at 87° C. for 2 hours, neutralized with sodium hydroxide after that, then filtered to separate and washed with water to obtain the titania composite.

(c) Subjecting the Titania Composite to the High-Temperature Heat Treatment

The titania composite obtained in step (b) is heated from room temperature up to 900° C. under the heating rate of 4° C./min, and then kept at this temperature for 65 min.

(d) Subjecting the Titania Composite to the Post Treatment

The titania composite treated by the high-temperature heating is crushed and sieved, to obtain the product.

The invention claimed is:

1. A method of preparing a titania composite, the titania composite comprising an inner core and a coating film layer wherein the inner core is a barium sulfate crystal and/or a strontium sulfate crystal with subsphaeroidal appearance, having a particle size of less than 1 μm and a whiteness of more than 98%, and the coating film layer is nano rutile titania; the method comprising:
   (a) preparing barium sulfate or strontium sulfate by consecutively reacting barium sulfide or strontium sulfide with excess sulfuric acid by cocurrent flowing to produce barium sulfate or strontium sulfate and hydrogen sulfide, discharging the hydrogen sulfide by degassing, then obtaining a suspension of barium sulfate or strontium sulfate after separating and washing treatment;
   (b) coating treatment by adding titanium tetrachloride or titanyl sulfate into the suspension of barium sulfate and/or strontium sulfate, wherein an amount of $TiO_2$ in the titanium tetrachloride or titanyl sulfate is 4% to 35% in a total weight of $TiO_2$ and barium sulfide and/or strontium sulfide when addition amount of titanium tetrachloride or titanyl sulfate is based on stoichiometric amount of $TiO_2$ in the titanium tetrachloride or titanyl sulfate; hydrolyzing and coating in a temperature range of 60° C. to 95° C. for 2 to 4 hours, then obtaining a titania composite after separating and washing treatment;
   (c) subjecting the titania composite to a high-temperature heat treatment by subjecting the titania composite obtained in step (b) to a high-temperature heat treatment in a temperature range of 600° C. to 1200° C. for 50 min to 70 min; and
   (d) subjecting the titania composite to a post treatment by cooling the titania composite treated after high-temperature heat treatment, crushing and sieving, to obtain a product.

2. The method of preparing the titania composite according to claim 1, wherein, in the step (a), a concentration of barium sulfide and/or strontium sulfide in solution is 70 to 130 g/L, a temperature of reaction is 45° C. to 85° C., and a speed of adding barium sulfide solution is 500 L/h to 4500 L/h and a speed of adding strontium sulfide solution is 100 L/h to 4000 L/h.

3. The method of preparing the titania composite according to claim 1, wherein, in the step (a), a concentration of sulfuric acid remained in a slurry of barium sulfate or strontium sulfate is 0.5 to 25 g/L, after carrying out the reaction between the barium sulfide and/or strontium sulfide and excess sulfuric acid.

4. The method of preparing the titania composite according to claim 1, wherein, in the step (a), said barium sulfide is produced by calcinating barite by virtue of coal and said strontium sulfide is produced by calcinating strontium sulfate by virtue of coal.

5. The method of preparing the titania composite according to claim 1, wherein, in the step (a), hot air is introduced in a slurry of barium sulfate or strontium sulfate for degassing after carrying out the reaction, wherein a volume of hot air is 3000 $M^3$/h to 7000 $M^3$/h, a temperature of hot air is 45° C. to 80° C., and a degassing time is 1.5 to 3 hours.

6. The method of preparing the titania composite according to claim 1, wherein, in the step (b), after carrying out the procedures of hydrolyzing and coating, neutralization is conducted with a base before the procedure of separating.

7. The method of preparing the titania composite according to claim 1, wherein, in the step (c), the titania composite obtained in the step (b) is firstly heated up to a temperature of 600° C. to 1200° C. under a heating rate of 2° C./min to 5° C./min, and then keeping the temperature for 50 min to 70 min.

8. A titania composite comprising an inner core and a coating film layer, wherein, the inner core is a barium sulfate crystal and/or a strontium sulfate crystal with subsphaeroidal appearance, having a particle size of less than 1 μm and whiteness of more than 98%, and the coating film layer is nano rutile titania; and the titania composite is prepared by a method comprising:
   (a) preparing barium sulfate or strontium sulfate by consecutively reacting barium sulfide or strontium sulfide with excess sulfuric acid by cocurrent flowing to produce barium sulfate or strontium sulfate and hydrogen sulfide, discharging the hydrogen sulfide by degassing, then obtaining a suspension of barium sulfate or strontium sulfate after separating and washing treatment;
   (b) coating treatment by adding titanium tetrachloride or titanyl sulfate into the suspension of barium sulfate and/or strontium sulfate, wherein an amount of $TiO_2$ in the titanium tetrachloride or titanyl sulfate is 4% to 35% in a total weight of $TiO_2$ and barium sulfide and/or strontium sulfide when addition amount of titanium tetrachloride or titanyl sulfate is based on stoichiometric amount of $TiO_2$ in the titanium tetrachloride or titanyl sulfate; hydrolyzing and coating in a temperature range of 60° C. to 95° C. for 2 to 4 hours, then obtaining a titania composite after separating and washing treatment;

(c) subjecting the titania composite to a high-temperature heat treatment by subjecting the titania composite obtained in step (b) to a high-temperature heat treatment in a temperature range of 600° C. to 1200° C. for 50 min to 70 min; and (d) subjecting the titania composite to a post treatment by cooling the titania composite treated after high-temperature heat treatment, crushing and sieving, to obtain a product.

9. A method of preparing a titania composite, the titania composite comprising an inner core and a coating film layer wherein the inner core is a barium sulfate crystal and/or a strontium sulfate crystal with subsphaeroidal appearance, having a particle size of less than 1 μm and a whiteness of more than 98%, and the coating film layer is nano rutile titania; the method comprising:

(a) preparing barium sulfate or strontium sulfate by consecutively reacting barium sulfide or strontium sulfide with excess sulfuric acid by cocurrent flowing to produce barium sulfate or strontium sulfate and hydrogen sulfide, discharging the hydrogen sulfide by degassing, then obtaining a suspension of barium sulfate or strontium sulfate after separating and washing treatment; wherein a concentration of sulfuric acid remained in a slurry of barium sulfate or strontium sulfate is 0.5 to 25 g/L, after carrying out the reaction between the barium sulfide and/or strontium sulfide and excess sulfuric acid;

(b) coating treatment by adding titanium tetrachloride or titanyl sulfate into the suspension of barium sulfate and/or strontium sulfate, wherein an amount of $TiO_2$ in the titanium tetrachloride or titanyl sulfate is 4% to 35% in a total weight of $TiO_2$ and barium sulfide and/or strontium sulfide when addition amount of titanium tetrachloride or titanyl sulfate is based on stoichiometric amount of $TiO_2$ in the titanium tetrachloride or titanyl sulfate; hydrolyzing and coating in a temperature range of 60° C. to 95° C. for 2 to 4 hours, then obtaining a titania composite after separating and washing treatment;

(c) subjecting the titania composite to a high-temperature heat treatment by subjecting the titania composite obtained in step (b) to a high-temperature heat treatment in a temperature range of 600° C. to 1200° C. for 50 min to 70 min; and (d) subjecting the titania composite to a post treatment by cooling the titania composite treated after high-temperature heat treatment, crushing and sieving, to obtain a product.

* * * * *